United States Patent
Wang et al.

(10) Patent No.: US 7,982,626 B2
(45) Date of Patent: Jul. 19, 2011

(54) PROPER GROUNDING DETECTION AND ALARM CIRCUIT FOR ELECTRONIC DEVICE

(75) Inventors: Ning Wang, Shenzhen (CN); Bing-Jian Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 253 days.

(21) Appl. No.: 12/324,881

(22) Filed: Nov. 27, 2008

(65) Prior Publication Data

US 2010/0102977 A1    Apr. 29, 2010

(30) Foreign Application Priority Data

Oct. 28, 2008    (CN) .......................... 2008 1 0305243

(51) Int. Cl.
  *G08B 21/00*    (2006.01)
(52) U.S. Cl. .......... 340/650; 340/649; 340/645; 361/45; 361/22; 361/86
(58) Field of Classification Search .................. 340/650, 340/649, 645, 646; 361/24, 45, 50, 86, 77, 361/78, 88, 49
  See application file for complete search history.

(56) References Cited

U.S. PATENT DOCUMENTS

| | | | | |
|---|---|---|---|---|
| 3,887,867 A | * | 6/1975 | Safer et al. | 324/546 |
| 3,911,323 A | * | 10/1975 | Wilson et al. | 361/42 |
| 3,962,606 A | * | 6/1976 | Burns et al. | 361/45 |
| 4,649,454 A | * | 3/1987 | Winterton | 361/50 |
| 4,992,723 A | * | 2/1991 | Zylstra et al. | 323/324 |
| 5,113,303 A | * | 5/1992 | Herres | 361/45 |
| 5,151,841 A | * | 9/1992 | Knights | 361/86 |
| 5,428,347 A | * | 6/1995 | Barron | 340/604 |
| 5,859,756 A | * | 1/1999 | Pressman et al. | 361/90 |
| 6,031,700 A | * | 2/2000 | Yang | 361/45 |
| 6,057,996 A | * | 5/2000 | Kim | 361/42 |
| 6,359,761 B1 | * | 3/2002 | Sid | 361/42 |

* cited by examiner

*Primary Examiner* — George A Bugg
*Assistant Examiner* — Hoi C Lau
(74) *Attorney, Agent, or Firm* — Zhigang Ma

(57) ABSTRACT

A detection and alarm circuit includes a transformer, a rectifier, and an alarm. A first input terminal of the transformer is connected to a ground terminal of an electronic device, and a second terminal of the transformer is grounded. A first output terminal of the transformer is connected to a first input terminal of the rectifier, and a second output terminal of the transformer is connected to a second input terminal of the rectifier. A first output terminal of the rectifier is connected to a first terminal of the alarm. A second output terminal of the rectifier is connected to a second terminal of the alarm.

11 Claims, 1 Drawing Sheet

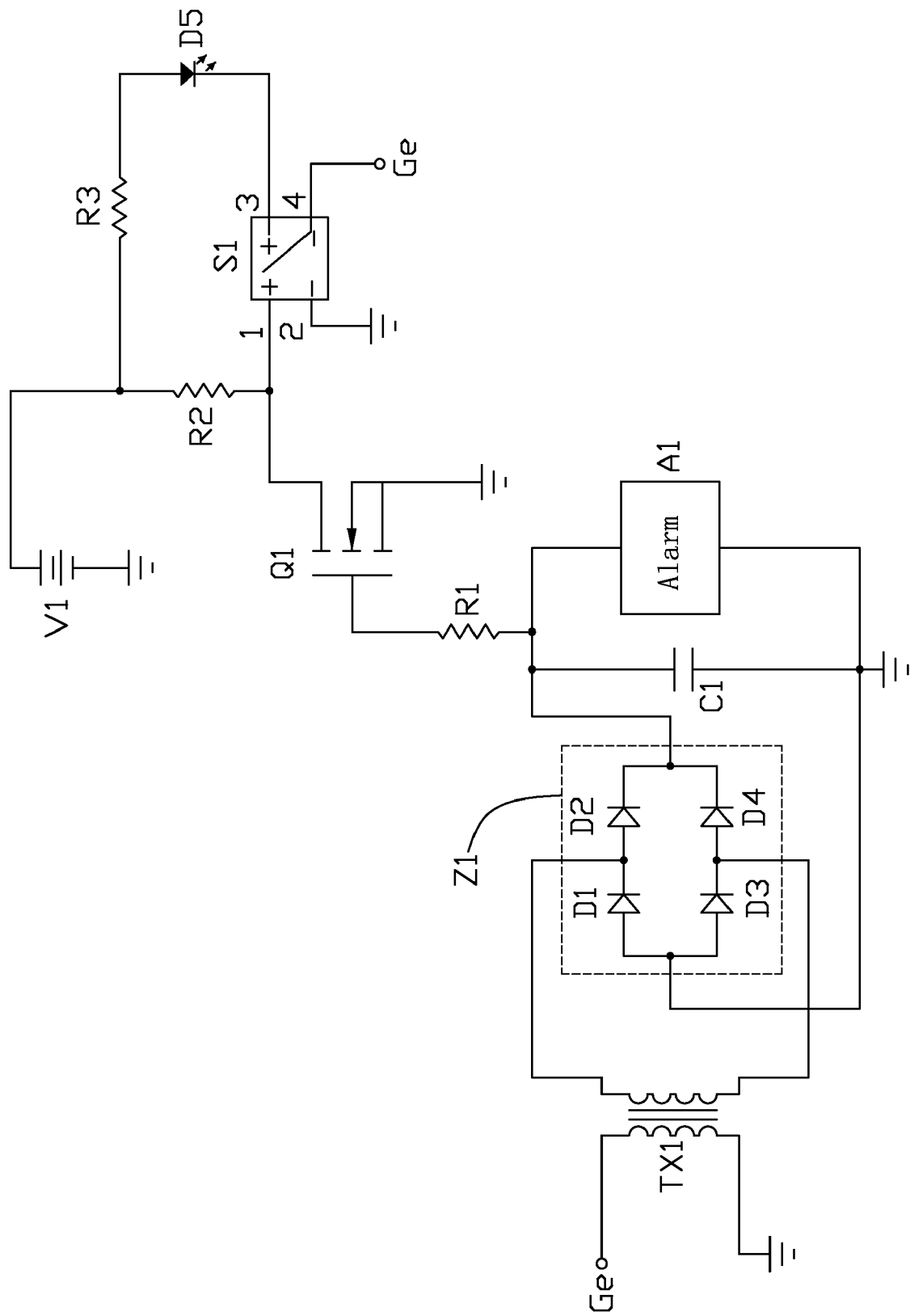

PROPER GROUNDING DETECTION AND ALARM CIRCUIT FOR ELECTRONIC DEVICE

BACKGROUND

1. Technical Field

The present disclosure relates to detection and alarm circuits and, particularly, to a detection and alarm circuit for detecting grounding status of an electronic device.

2. Description of Related Art

Electronic devices are widely used. If an electronic device is not well grounded, there may be a 110 volt alternating current (AC) accumulation voltage at a ground terminal of the electronic device. The accumulation AC voltage can not only damage the electronic device, but also harm users. Therefore, an oscillograph is often used to connect to the ground terminal of the electronic device to detect whether the electronic device is well grounded. However, if many electronic devices are to be detected, it is costly and inefficient.

What is needed, therefore, it is to provide a detection and alarm circuit to overcome the above described shortcomings.

BRIEF DESCRIPTION OF THE DRAWING

The drawing is a circuit diagram of an embodiment of a detection and alarm circuit for detecting grounding status.

DETAILED DESCRIPTION

Referring to the drawing, an embodiment of a detection and alarm circuit for detecting grounding status of an electronic device includes a transformer TX1, a rectifier Z1, a capacitor C1, an alarm A1, three resistors R1-R3, a field effect transistor (FET) Q1, a light emitting diode (LED) D5, and a relay S1. In this embodiment, the rectifier Z1 is a bridge rectifier including four diodes D1-D4, and includes a first input terminal between a cathode of the diode D1 and an anode of the diode D2, a second input terminal between a cathode of the diode D3 and an anode of the diode D4, a first output terminal between anodes of the diodes D1 and D3, and a second output terminal between cathodes of the diode D2 and D4. The FET Q1 as a switch is an N channel metal oxide semiconductor (NMOS) FET. The relay S1 as a switch is a regularly open relay, and includes two control terminals 1, 2, and two controlled terminals 3, 4. The power supply V1 can supply 5 volts direct current (DC). The alarm A1 is an audible alarm in this embodiment.

Two input terminals of the transformer TX1 are connected to a ground terminal Ge of the electronic device and ground. Two output terminals of the transformer TX1 are connected to the first and second input terminals of the rectifier Z1. The capacitor C1 and the alarm A1 are connected in parallel between the first and second output terminals of the rectifier Z1. The first output terminal of the rectifier Z1 is grounded. A gate of the FET Q1 is connected to the second output terminal of the rectifier Z1 via the resistor R1. A source of the FET Q1 is grounded. A drain of the FET Q1 is connected to the power supply V1 via the resistor R2. The control terminal 1 of the relay S1 is connected to the drain of the FET Q1. The control terminal 2 of the relay S1 is grounded. The controlled terminal 3 of the relay S1 is connected to the power supply V1 via the resistor R3 and the LED D5. The controlled terminal 4 of the relay S1 is connected to the ground terminal Ge of the electronic device.

In other embodiments, the FET Q1 can be other types of switches, such as a positive-negative-positive transistor. The rectifier Z1 can also be other types of rectifiers, such as pressure rectifiers. The alarm A1 can be other types of alarm devices.

When the ground terminal Ge of the electronic device is not well grounded, the alarm A1 activates and the LED D5 does not emit light. When the ground terminal Ge of the electronic device is well grounded, the alarm A1 is not activated and the LED D5 emits light.

A detailed description is as following. When the ground terminal Ge of the electronic device is well grounded, there is no voltage at the ground terminal Ge. The transformer TX1 and the rectifier Z1 do not operate, the alarm A1 is not activated, and the gate of the FET Q1 is at low voltage level and the FET Q1 is turned off. At the same time, a current flows through the control terminals 1 and 2 of the relay S1 so that the controlled terminals 3 and 4 of the relay S1 are connected. A current flows through the resistor R3, the LED D5, and the controlled terminals 3 and 4 of the relay S1. The LED D5 emits light, indicating the ground terminal Ge of the electronic device is well grounded.

When the ground terminal Ge of the electronic device is not well grounded, there is an accumulation AC voltage at the ground terminal Ge of the electronic device, such as a 110 volt voltage. The transformer TX1 converts the accumulation AC voltage to a smaller AC voltage to provide to the rectifier Z1. The rectifier Z1 converts the smaller AC voltage to a DC voltage to provide to the alarm A1. The alarm A1 activates, indicating that the ground terminal Ge of the electronic device is not well grounded. At the same time, the gate of the FET Q1 is at high voltage level and the FET Q1 is turned on. No current flows through the control terminals 1 and 2 of the relay S1 so that the controlled terminals 3 and 4 of the relay S1 are not connected. The LED D5 does not emit light, also indicating that the ground terminal Ge of the electronic device is not well grounded.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A detection and alarm circuit for detecting grounding status of an electronic device, comprising:
   a transformer comprising two input terminals connected to a ground terminal of the electronic device and ground, and a first and second output terminals;
   a rectifier comprising two input terminals connected to the first and second output terminals of the transformer, respectively, a first output terminal grounded, and a second output terminal;
   an alarm comprising a first terminal connected to the second output terminal of the rectifier, and a second terminal grounded;
   a first switch comprising a first terminal grounded via a first resistor and the alarm, a second terminal grounded, and a third terminal connected to a power supply via a second resistor;
   a second switch comprising a first control terminal connected to the third terminal of the first switch, a second control terminal grounded, a first controlled terminal connected to the ground terminal of the electronic device, and a second controlled terminal; and a light emitting diode (LED) comprising an anode connected to the power supply via a third resistor, and a cathode connected to the second controlled terminal of the second switch;

wherein when the ground terminal of the electronic device is well grounded, the transformer and the rectifier do not operate, the alarm is not activated, the first terminal of the first switch is at low voltage level, the first switch is turned off, a current flows through the first and second control terminals of the second switch, the first and the second controlled terminals of the second switch are connected, and the LED emits light; when the ground terminal of the electronic device is not well grounded, the transformer converts an alternating current (AC) to a smaller AC voltage to provide to the rectifier, the rectifier is capable of converting the smaller AC voltage to a direct current (DC) voltage to provide to, and activate, the alarm, the first terminal of the first switch is at high voltage level, the first switch is turned on, no current flows through the first and second control terminals of the second switch, the first and second controlled terminals of the second switch are not connected, and the LED does not emit light.

2. The detection and alarm circuit of claim 1, wherein the first switch is an N channel metal oxide semiconductor field effect transistor (NMOS FET), the first, second, and third terminals of the first switch correspond to a gate, a source and a drain of the NMOS FET, the second switch is a regular open relay.

3. The detection and alarm circuit of claim 1, wherein the power supply is a 5-volt DC power supply.

4. The detection and alarm circuit of claim 1, further comprising a capacitor connected between the first and second output terminals of the rectifier.

5. The detection and alarm circuit of claim 1, wherein the rectifier is a bridge rectifier comprising four diodes, a cathode of a first diode and an anode of a second diode are connected to the first output terminal of the transformer, a cathode of a third diode and an anode of a fourth diode are connected to the second output terminal of the transformer, an anode of the first diode and an anode of the third diode are grounded, a cathode of the second diode and a cathode of the fourth diode are grounded via the alarm.

6. The detection and alarm circuit of claim 1, wherein the alarm is an audible alarm.

7. A detection and alarm circuit for detecting grounding status of an electronic device, comprising:
a transformer,
a rectifier,
a first switch,
a second switch, and
a light emitting diode (LED);

wherein two input terminals of the transformer are connected to a ground terminal of an electronic device and ground; two input terminals of the rectifier are connected to two output terminals of the transformer, respectively, a first output terminal of the rectifier is connected to a first terminal of the first switch; a second output terminal of the rectifier is grounded, a second terminal of the first switch is grounded, a third terminal of the first switch is connected to a power supply via a second resistor, and connected to a first control terminal of the second switch, a second control terminal of the second switch is grounded, a first controlled terminal of the second switch is connected to a cathode of the first LED, a second controlled terminal of the second switch is connected to the ground terminal of the electronic device, and an anode of the LED is connected to the power supply via a third resistor;

wherein when the ground terminal of the electronic device is well grounded and the first terminal of the first switch is at low voltage level, the first switch is turned off, a current flows through the first and the second control terminals of the second switch, the first and the second controlled terminals of the second switch are connected, the LED emits light, when the ground terminal of the electronic device is not well grounded and the first terminal of the first switch is at high voltage level, the first switch is turned on, no current flows through the first and second control terminals of the second switch, the first and second controlled terminals of the second switch are not connected, the LED does not emit light.

8. The detection and alarm circuit of claim 7, wherein the rectifier is a bridge rectifier comprising four diodes, a cathode of the first diode and an anode of the second diode are connected to a first output terminal of the transformer, a cathode of the third diode and an anode of the fourth diode are connected to a second output terminal of the transformer, an anode of the first diode and an anode of the third diode are grounded, a cathode of the second diode and a cathode of the fourth diode are connected to the first terminal of the first switch via the first resistor.

9. The detection and alarm circuit of claim 7, wherein the first switch is an N channel metal oxide semiconductor field effect transistor (NMOS FET), the first, second, and third terminals of the first switch correspond to a gate, a source and a drain of the NMOS FET, the second switch is a regular open relay.

10. The detection and alarm circuit of claim 7, wherein the first switch is a negative-positive-negative transistor.

11. The detection and alarm circuit of claim 7, wherein the rectifier is a pressure rectifier.

* * * * *